United States Patent [19]
Tsai et al.

[11] Patent Number: 5,631,112
[45] Date of Patent: May 20, 1997

[54] MULTIPLE EXPOSURE METHOD FOR PHOTO-EXPOSING PHOTOSENSITIVE LAYERS UPON HIGH STEP HEIGHT TOPOGRAPHY SUBSTRATE LAYERS

[75] Inventors: Ming-Horn Tsai, Hsinchu; Bin Liu, Taipei; Shih-Yin Lan, Hsin-Chu, all of Taiwan

[73] Assignee: Vanguard International Semiconductor Corporation, Hsin-Chu, Taiwan

[21] Appl. No.: 726,033

[22] Filed: Oct. 7, 1996

Related U.S. Application Data

[63] Continuation of Ser. No. 558,489, Nov. 16, 1995, abandoned.

[51] Int. Cl.⁶ .................................................. G03F 9/00
[52] U.S. Cl. ........................... 430/22; 430/394; 430/312
[58] Field of Search ........................... 430/394, 396, 430/312, 22; 437/229

[56] References Cited

U.S. PATENT DOCUMENTS

| | | | |
|---|---|---|---|
| 4,869,999 | 9/1989 | Fukuda et al. | 430/311 |
| 5,001,038 | 3/1991 | Dorinski et al. | 430/311 |
| 5,128,738 | 7/1992 | Lee et al. | 357/41 |
| 5,242,770 | 9/1993 | Chen et al. | 430/5 |
| 5,323,049 | 6/1994 | Motonami | 257/401 |
| 5,498,500 | 3/1996 | Bae | 430/22 |
| 5,532,091 | 7/1996 | Mizutani | 430/22 |

*Primary Examiner*—John A. McPherson
*Attorney, Agent, or Firm*—George O. Saile; Alek P. Szecsy

[57] ABSTRACT

A method for photo-exposing a blanket conformal photosensitive layer upon a high step height topography substrate layer. There is first provided a high step height topography substrate layer having a blanket conformal photosensitive layer formed thereupon. The high step height topography substrate layer has a first region having a first step height separated from a third region having a third step height by a second region having a second step height. The second step height is intermediate to the first step height and the third step height. The blanket conformal photosensitive layer is photo-exposed to form a first pattern upon the first region and the second region through use of a first reticle and a first photo-exposure condition. The first photo-exposure condition provides a first depth of focus suitable for at least the first region. In a separate process step, the blanket conformal photosensitive layer is photo-exposed to form a second pattern upon the second region and the third region through use of a second reticle and a second photo-exposure condition. The second photo-exposure condition provides a second depth of focus suitable for at least the third region. The first pattern upon the second region and the second pattern upon the second region overlap.

19 Claims, 4 Drawing Sheets

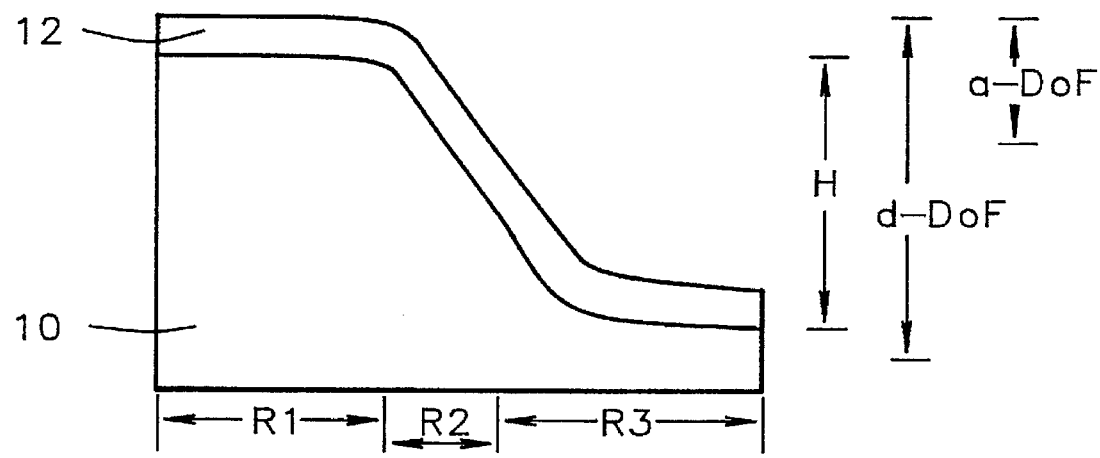
FIG. 1 - Prior Art
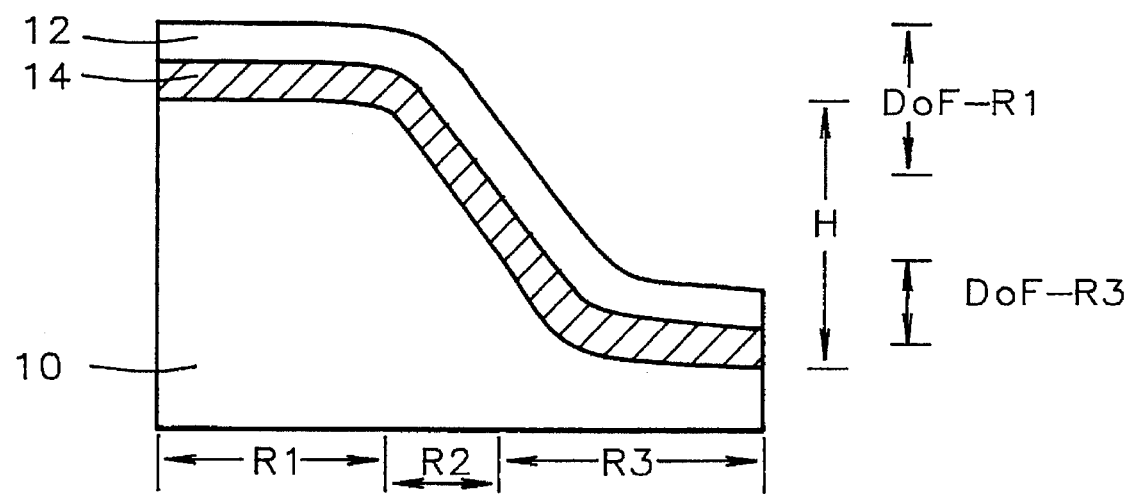
FIG. 2

MULTIPLE EXPOSURE METHOD FOR PHOTO-EXPOSING PHOTOSENSITIVE LAYERS UPON HIGH STEP HEIGHT TOPOGRAPHY SUBSTRATE LAYERS

CROSS-REFERENCE TO RELATED APPLICATION

This application is a continuation of U.S. patent application Ser. No. 08/558,489, filed 16 Nov. 1995, now abandoned.

BACKGROUND OF THE INVENTION

1. Field of the Invention

The present invention relates generally to methods for photo-exposing photosensitive layers within integrated circuits. More particularly, the present invention relates to methods for photo-exposing photosensitive layers which bridge from low step height to high step height substrate layers within integrated circuits.

2. Description of the Related Art

Integrated circuits are formed from semiconductor substrates within and upon whose surfaces are formed resistors, transistors, diodes and other electrical circuit elements. These electrical circuit elements are interconnected internally and externally to the semiconductor substrate upon which they are formed through patterned conductor layers which are separated by insulator layers.

As semiconductor technology has advanced, the complexity of integrated circuits has increased in both the horizontal and vertical dimensions. In particular, with respect to complexity in the vertical dimension it is common in the art that advanced integrated circuits will often have topographic step height variations of at least one micron, over which topographic step height variations it is desired to form patterned layers, typically patterned conductor layers.

While the substantial topographic step height variations typically encountered in advanced integrated circuits are often inevitable in the design and manufacture of those advanced integrated circuits, such topographic step height variations often provide significant impediments to manufacturing those advanced integrated circuits. In particular, substantial topographic step height variations often provide significant difficulties in providing upon substrate layers exhibiting those substantial topographic step height variations patterned layers having high resolution throughout the complete topographic step height variation through which those patterned layers are desired to be patterned. These difficulties are typically based in the limited depth of focus typically achievable with advanced photolithographic exposure tooling in comparison with substantial topographic step height variations through which high resolution photo-exposure of patterned layers is desired.

The problem associated with the limited depth of focus is illustrated by reference to FIG. 1. Shown in FIG. 1 is a substrate layer 10 which has a first region R1 having a high step height plateau formed therein vertically separated from a third region R3 having a low step height plateau formed therein by a second region R2 of intermediate step height. The high step height plateau is separated from the low step height plateau by a topographic step height variation H. Formed upon the substrate layer 10 is a blanket conformal photosensitive layer 12 which is desired to be patterned with high resolution through the complete topographic step height variation H. In order to accomplish this high resolution patterning, the blanket conformal photosensitive layer 12 is preferably photo-exposed through a reticle (not shown) under exposure conditions to provide a desired Depth of Focus d-DoF which spans the topographic step height variation H. Unfortunately, the desired Depth of Focus d-DoF conditions are typically not achievable with advanced photo-exposure tooling and conventional reticles. Typically, achievable Depth of Focus a-DoF conditions are achieved, where the achievable Depth of Focus a-DoF is significantly less than either the desired Depth of Focus d-DoF or the topographic step height variation H.

The depth of focus limitations in forming high resolution patterned layers which bridge topographic step height variations from high step height to low step height substrate layers within integrated circuits are generally known as a detractor which potentially limits the heights of topographic step height variations upon which high resolution patterned conformal photosensitive layers may be formed in integrated circuits. Unfortunately, however, little is disclosed in the art regarding methods by which depth of focus limitations may be overcome in order to provide high resolution patterned conformal photosensitive layers upon high step height topography substrate layers within integrated circuits.

Thus, it is towards the goal of forming high resolution patterned conformal photosensitive layers upon high step height topography substrate layers within integrated circuits, which high resolution patterned conformal photosensitive layers maintain their high resolution throughout the differences in step height within the high step height topography substrate layers, that the present invention is directed.

SUMMARY OF THE INVENTION

An object of the present invention is to provide a method for forming high resolution patterned photosensitive layers upon high step height topography substrate layers within integrated circuits, which high resolution patterned photosensitive layers maintain their high resolution throughout the differences in step height of the high step height topography substrate layers.

A second object of the present invention is to provide a method in accord with the first object of the present invention, which method is also manufacturable.

In accord with the objects of the present invention, a method for forming high resolution patterned photosensitive layers upon high step height topography substrate layers within integrated circuits is disclosed along with the high resolution patterned photosensitive layers which result from the method. To practice the method of the present invention, there is first provided a high step height topography substrate layer having a blanket conformal photosensitive layer formed thereupon. The high step height topography substrate layer has a first region having a first step height separated from a third region having a third step height by a second region having a second step height. The second step height is intermediate to the first step height and the third step height. The blanket conformal photosensitive layer is then photo-exposed to form a first pattern upon the first region and the second region through use of a first reticle and a first photo-exposure condition. The first photo-exposure condition provides a first depth of focus suitable for at least the first region. The blanket conformal photosensitive layer is then photo-exposed to form a second pattern upon the second region and the third region through use of a second reticle and a second photo-exposure condition. The second photo-exposure condition provides a second depth of focus suitable for at least the third region. The first photo-exposure and the second photo-exposure are undertaken such that the first pattern upon the second region and the second pattern upon the second region overlap.

The method of the present invention provides a high resolution patterned conformal photosensitive layer upon a high step height topography substrate layer within an integrated circuit, which high resolution patterned conformal photosensitive layer maintains its high resolution throughout the differences in step height upon the high step height topography substrate layer. By undertaking the multiple photo-exposures of the method of the present invention there is formed a high resolution patterned conformal photosensitive layer upon a high step height topography substrate layer within an integrated circuit, which high resolution patterned conformal photosensitive layer maintains its high resolution through out the differences in step height upon the high step height topography substrate layer. The portion of the patterned conformal photosensitive layer which resides upon the intermediate step height level of the high step height topography substrate layer receives a double photo-exposure of light which may not have optimal depth of focus. Due to the double exposure, the portion of the patterned conformal photosensitive layer which resides upon the intermediate step height level of the high step height topography substrate layer will typically nonetheless still be adequately patterned to form a high resolution patterned conformal photosensitive layer.

The method of the present invention is readily manufacturable. The method of the present invention provides multiple photo-exposures of a single blanket conformal photosensitive layer upon a high step height topography substrate layer. The multiple exposures are undertaken through multiple reticles, the multiple exposures having multiple depths of focus. The method of the present invention will typically, although not exclusively, be accomplished through exchanging reticles and adjusting photo-exposure conditions within photo-exposure tooling within which the high step height topography substrate layer upon which is desired a high resolution patterned conformal photosensitive layer resides. Exchanges of reticles and adjustment of photo-exposure conditions within photo-exposure tooling provide for readily manufacturable processes.

BRIEF DESCRIPTION OF THE DRAWINGS

The accompanying drawings, which form a material part of this disclosure, show the following:

FIG. 1 shows a schematic cross-sectional diagram illustrating a blanket conformal photosensitive layer upon a high step height topography substrate layer, along with depths of focus typically desired and typically achieved when photo-patterning the blanket conformal photosensitive layer upon the high step height topography substrate layer through methods of the prior art.

FIG. 2 shows a schematic cross-sectional diagram illustrating a blanket conformal photosensitive layer upon a high step height topography substrate layer, along with depths of focus typically achieved when photo-patterning the photosensitive layer through the method of the present invention.

DESCRIPTION OF THE PREFERRED EMBODIMENTS

Figure 3:
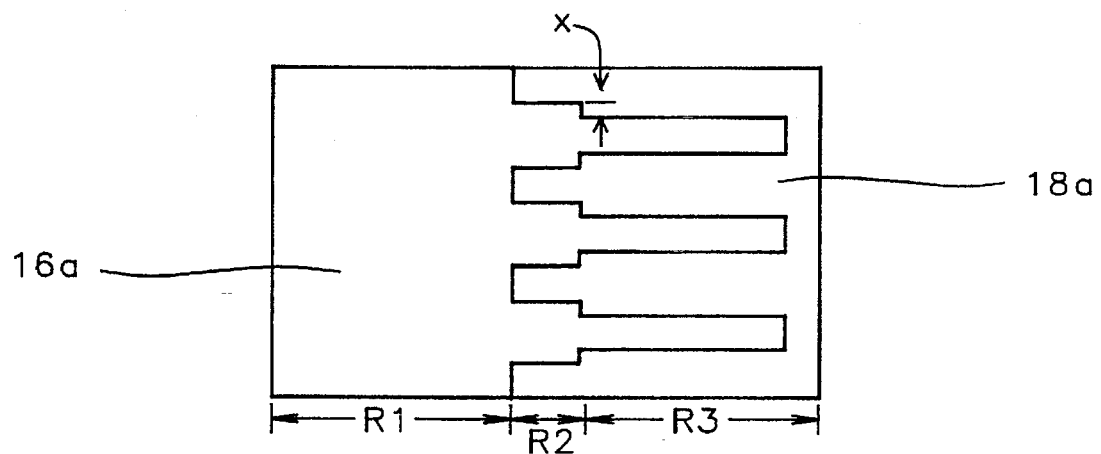
FIG. 3 and FIG. 4 show schematic plan-view diagrams illustrating the patterns in a pair of reticles which may be employed along with a positive photoresist in forming high resolution patterned conformal photosensitive layers in accord with the first preferred embodiment of the present invention.

The present invention provides a method for forming from a blanket conformal photosensitive layer a high resolution patterned conformal photosensitive layer upon a high step height topography substrate layer within an integrated circuit, where the high resolution patterned conformal photosensitive layer maintains its high resolution throughout the topography of the high step height topography substrate layer. The method of the present invention achieves this goal through employing multiple reticles along with multiple photo-exposure conditions to yield high resolution patterns upon the blanket conformal photosensitive layer. The multiple photo-exposure conditions are undertaken at multiple depths of focus appropriate to the height upon the high step height topography substrate layer at which the blanket conformal photosensitive layer resides. Also provided by the method of the present invention is an overlap between adjoining photo-patterns upon the patterned conformal photosensitive layer.

The method of the present invention may be employed in photo-lithographically forming patterned conformal photosensitive layers from blanket conformal photosensitive layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in forming high resolution patterned conformal photosensitive layers upon high step height topography substrate layers within integrated circuits.

Referring now to FIG. 2 there is shown a schematic cross-sectional diagram illustrating a high step height topography substrate layer upon which may be practiced the method of the present invention. Also shown in FIG. 2 are depth of focus ranges through which may be practiced the preferred embodiments of the present invention upon the high step height topography substrate layer. Analogously to FIG. 1, there is shown in FIG. 2 a substrate layer 10 having a topographic step height variation H progressing from a first region R1 having a high step height plateau to a third region R3 having a low step height plateau through a second region R2 of intermediate step height. Upon the surface of the substrate layer 10 is a blanket conformal conductor layer 14 upon which resides a blanket conformal photosensitive layer 12. In the typical execution of the method of the present invention, the blanket conformal photosensitive layer 12 is formed of a photoresist which is desired to be patterned through: (1) photo-exposure through a reticle, and (2) subsequent developing, such that a patterned conformal photosensitive layer is formed from the blanket conformal photosensitive layer 12. The patterned conformal photosensitive layer of photoresist may then serve as an etch mask for patterning of the blanket conformal conductor layer 14.

Within the typical execution of the method of the present invention, there exist two preferred embodiments of the present invention. The first preferred embodiment of the present invention employs a positive photoresist material in forming the blanket conformal photosensitive layer 12. The second preferred embodiment employs a negative photoresist material in forming the blanket conformal photosensitive layer 12.

As is understood by a person skilled in the art, layers other than the blanket conformal conductor layer 14 may also ultimately be patterned through use of the method of the present invention. Typically, the blanket conformal conductor layer 14, or other type of layer which is desired to be patterned in high resolution through the method of the present invention is from about 2000 to about 10000 angstroms thick, and the blanket conformal photosensitive layer 12, which is typically formed from a photoresist, is from about 10000 to about 12000 angstroms thick.

Also shown in FIG. 2 are the typically achieved Depth of Focus in Region 1 DoF-R1, and the typically achieved Depth of Focus in Region 3 DoF-R3, through which may be photo-exposed the blanket conformal photosensitive layer 12 which resides upon the substrate layer 10. The method of the present invention provides value in forming upon the surfaces of high step height topography substrate layers high resolution patterned conformal photosensitive layers when the topographic step height variation H is substantial in comparison with either the Depth of Focus in Region 1 DoF-R1 or the Depth of Focus in Region 3 DoF-R3. Typically, the Depth of Focus in Region 1 DoF-R1 and the Depth of Focus in Region 3 DoF-R3 will be substantially equal to each other at about 6000 to about 8000 angstroms each. Preferably, the topographic step height variation, H, will be from about 12000 to about 20000 angstroms.

As is understood by a person skilled in the art, the method of the present invention is not limited to photo-exposing the blanket photosensitive layer 12 through a method which employs only the Depth of Focus in Region 1 DoF-R1 and the Depth of Focus in Region 3 DoF-R3, which are illustrated by the preferred ranges as shown in FIG. 2. Rather, for a substrate layer 10 having appropriately high topographic step height variation H, there may be undertaken additional exposures at additional depths of focus and additional locations along the blanket conformal photosensitive layer 12 such that a high resolution patterned conformal photosensitive layer may be formed throughout the entire topographic step height variation H. It is also not required for the present invention that the portion of the blanket conformal photosensitive layer 12 residing in the second region R2 be outside the Depth of Focus in Region 1 DoF-R1 and the Depth of Focus in Region 3 DoF-R3. The portion of the blanket conformal photosensitive layer 12 residing in the second region R2 may be encompassed by: (1) the Depth of Focus in Region 1 DoF-R1, (2) the Depth of Focus in Region 3 DoF-R3, (3) both the Depth of Focus in Region 1 DoF-R1 and the Depth of Focus in Region 3 DoF-R3, or (4) neither the Depth of Focus in Region 1 DoF-R1 nor the Depth of Focus in Region 3 DoF-R3.

Most preferably, the portion of the blanket photosensitive layer 12 residing in the second region R2 will be encompassed by neither the Depth of Focus in Region 1 DoF-R1 nor the Depth of Focus in Region 3 DoF-R3. Most preferably, the vertical depth of the blanket conformal photosensitive layer 12 within the second region R2 will be approximately equal to the Depth of Focus in Region 1 DoF-R1 and the Depth of Focus in Region 3 DoF-R3 at about 6000 to about 8000 angstroms.

Figure 4:
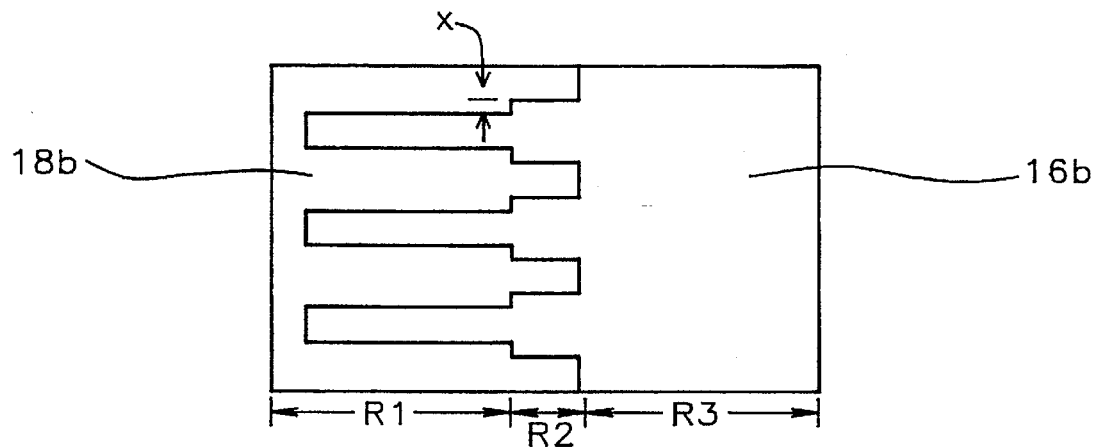
Figure 5:
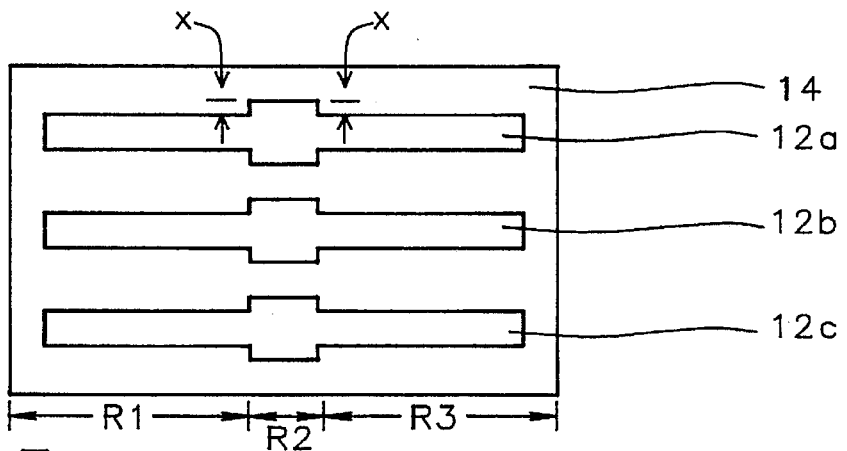
FIG. 5 shows a schematic plan-view diagram of the high resolution patterned conformal photosensitive layers which are formed through the method and materials of the first preferred embodiment of the present invention employing the pair of reticles whose patterns are illustrated in FIG. 3 and FIG. 4.

Referring now to FIG. 3 and FIG. 4 there is shown a pair of plan-view schematic diagrams illustrating a pair of masks which may be employed in forming from the blanket conformal photosensitive layer 12 within FIG. 2 a high resolution patterned conformal photosensitive layer. Illustrated in FIG. 5 is a schematic plan-view diagram of the patterned conformal photosensitive layers 12a, 12b and 12c which result from photo-exposure and photo-developing of the blanket conformal photosensitive layer 12 of FIG. 2 through the pair of masks whose patterns are illustrated in FIG. 3 and FIG. 4. The masks disclosed in FIG. 3 and FIG. 4 are employed with a positive photoresist, and the resulting patterned conformal photosensitive layers 12a, 12b and 12c are formed of photo-exposed and developed positive photoresist.

FIG. 3 shows a plan-view schematic diagram of a mask which exposes the blanket conformal photosensitive layer 12 which resides upon the lower step level region R3 and the intermediate region R2 of the high step height topographic substrate layer 10 illustrated in FIG. 2. Shown in FIG. 3 is a first patterned metal layer 16a which leaves exposed a first portion of a transparent substrate 18a. FIG. 4 shows the complementary mask which is employed along the mask whose patterns are illustrated in FIG. 3. The mask of FIG. 4 exposes the blanket conformal photosensitive layer 12 which resides the upper step level region R1 and the intermediate region R2 of the high step height topographic substrate layer 10 illustrated in FIG. 2. Shown in FIG. 4 is the complementary second patterned metal layer 16b which leaves exposed a second portion of a transparent substrate 18b.

Shown in FIG. 5 is a schematic plan-view diagram of the patterned conformal photosensitive layers 12a, 12b and 12c which are formed through patterning the blanket conformal photosensitive layer 12 through the method and materials of the first preferred embodiment of the present invention. The patterned conformal photosensitive layers 12a, 12b and 12c are shown residing upon the blanket conductor layer 14. The patterned conformal photosensitive layers 12a, 12b and 12c are formed through sequential photo-exposure of the blanket conformal photosensitive layer 12 through the masks whose patterns are illustrated in FIG. 3 and FIG. 4, followed by developing of the photo-exposed blanket conformal photosensitive layer 12. The photo-exposed blanket conformal photosensitive layer 12 is developed through methods and materials as are conventional in the art including, but not limited to wet chemical developing methods and dry plasma developing methods employing developer materials suitable to the positive photoresist material from which is formed the photo-exposed blanket conformal photosensitive layer 12 of the first preferred embodiment of the present invention.

Although not illustrated in FIG. 5, it is understood by a person skilled in the art that once the blanket conformal photosensitive layer 12 has been photo-exposed and developed into the patterned conformal photosensitive layers 12a, 12b and 12c, the blanket conformal conductor layer 14 may then be patterned through etching by using the patterned conformal photosensitive layers 12a, 12b and 12c as an etch mask to leave remaining patterned conductor layers whose projected dimensions are equivalent to those of the patterned conformal photosensitive layers 12a, 12b and 12c. Methods and materials through which blanket conformal conductor layers, such as blanket conformal conductor layer 14 may be patterned through an etch mask, such as an etch mask comprised of patterned conformal photosensitive layers 12a, 12b and 12c are known in the art. Such methods and materials include but are not limited to wet chemical etch methods and dry chemical etch methods employing etchant materials appropriate to the material from which is formed the blanket conformal conductor layer 14.

Finally, there is shown in FIG. 3 and FIG. 4 the presence of serifs of thickness X along both sides of the patterned metal layers 16a and 16b within the second region R2 of the two photo-masks which are employed in forming the high resolution patterned photosensitive layers 12a, 12b and 12c of the first preferred embodiment of the present invention. In addition, within FIG. 5 there is shown the corresponding serifs formed upon the two edges of each of the patterned photosensitive layers 12a, 12b and 12c within the second region R2 of the substrate layer 10 upon which resides the blanket conformal conductor layer 14.

The purpose of forming serifs upon the edges of each of the patterned photosensitive layers 12a, 12b and 12c within the second region R2 of the substrate layer 10 is to assure optimal overlap of the two portions of each individual patterned conformal photosensitive layer 12a, 12b or 12c. Preferably, the width X of each serif is approximately equal to one half the registration tolerance of the photo-exposure tooling which is employed to register the first reticle as illustrated in FIG. 3 and the second reticle as illustrated in FIG. 4 to the substrate layer 10. When the width X of each serif is approximately equal to one half the registration tolerance, the width of the patterned conformal photosensitive layers 12a, 12b, and 12c are assured of being no thinner in the second region R2 than they are in the first region R1 and the third region R3 of the substrate layer 10. Alternatively, as is understood by a person skilled in the art, serifs of width X approximately equal to the registration tolerance may be employed on either one but not both of the first reticle and the second reticle while still maintaining the width, but not necessarily the optimal resolution, of the high resolution patterned conformal photosensitive layers 12a, 12b and 12c of the present invention within the second region R2. Thus, serifs of the appropriate size may be incorporated: (1) within the first reticle only, (2) within the second reticle only, or (3) within both the first reticle and the second reticle, to form within the second region R2 of the patterned conformal photosensitive layers of the first preferred embodiment of the present invention serifs to assure optimal overlap of the two photo-exposures by which are formed the patterned conformal photosensitive layers of the first preferred embodiment of the present invention.

Under circumstances of dense packing and narrow linewidth spacing within an integrated circuit, a width X of the serifs within the second region R2 of the patterned conformal photosensitive layers 12a, 12b and 12c, the width X being approximately equal to one half the registration tolerance of the photo-exposure tooling employed to register the first reticle or the second reticle to the substrate layer 10, may not be achievable. Under such circumstances, a compromise of the width of the patterned photosensitive layers 12a, 12b and 12c within the second region R2 may be unavoidable.

Figure 6:
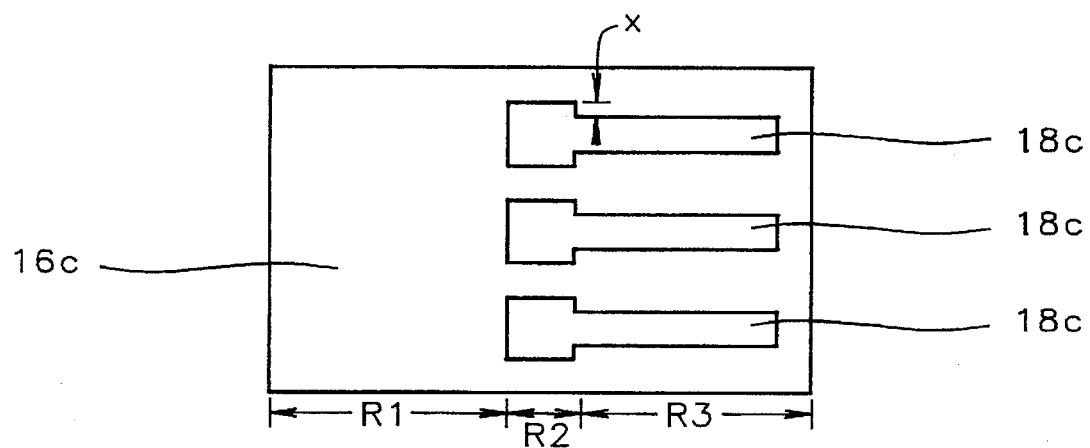
FIG. 6 and FIG. 7 show schematic plan-view diagrams illustrating the patterns in a pair of reticles which may be employed along with a negative photoresist in forming high resolution patterned conformal photosensitive layers in accord with the second preferred embodiment of the present invention.
Figure 7:
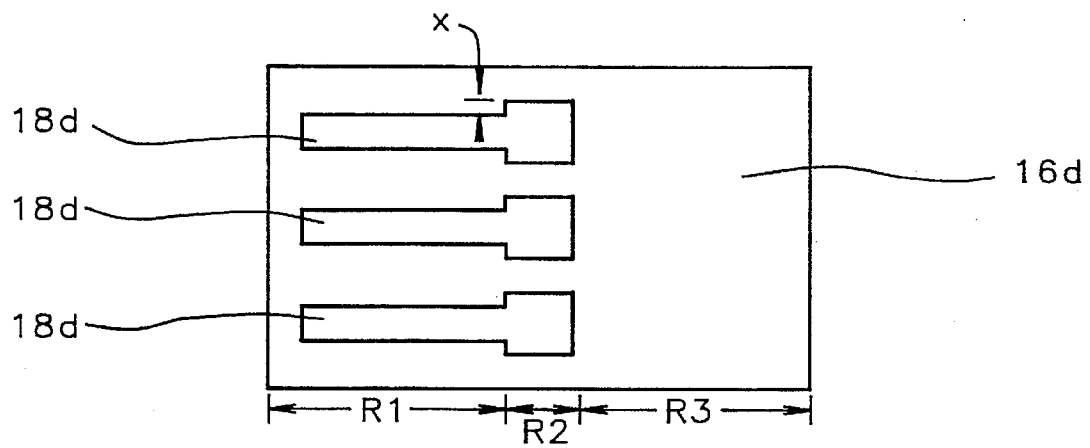

Referring now to FIG. 6 and FIG. 7, there is shown a pair of schematic cross-sectional diagrams illustrating a third reticle and a fourth reticle of the second preferred embodiment of the present invention, through which third reticle and fourth reticle may be photo-exposed a blanket conformal photosensitive layer 12 formed of a negative photoresist. Shown in FIG. 6 is the third reticle having a third patterned metal layer 16c with first apertures 18c in the third metal layer 16c exposing a portion of the transparent substrate upon which the third patterned metal layer 16c resides. The third reticle exposes portions of the blanket conformal photosensitive layer 12 residing upon the third region R3 and the second region R2 of the substrate layer 10. Shown in FIG. 7 is the fourth reticle which has a fourth patterned metal layer 16d having a partially overlapping set second apertures 18d formed therein exposing a partially overlapping portion of the transparent substrate upon which resides the fourth patterned metal layer 16d. The fourth reticle exposes portions of the blanket conformal photosensitive layer 12 residing upon the first region R1 and the second region R2 of the substrate layer 10.

Figure 8:
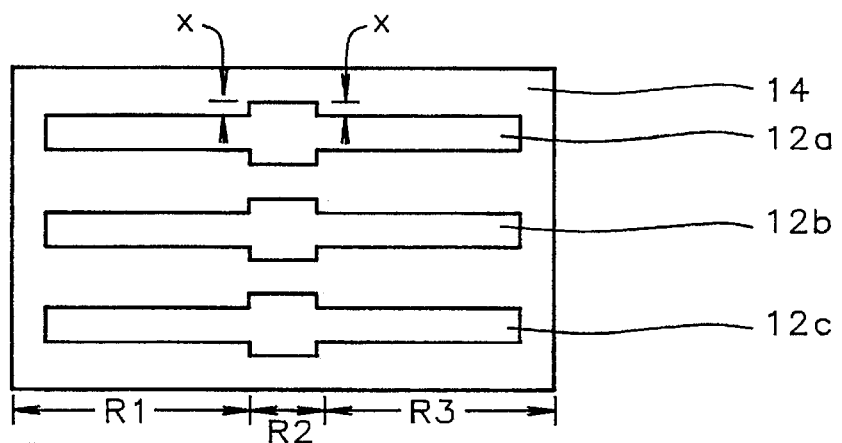
FIG. 8 shows a schematic plan-view diagram of the high resolution patterned conformal photosensitive layers which are formed through the method and materials of the second preferred embodiment of the present invention employing the pair of reticles whose patterns are illustrated in FIG. 6 and FIG. 7.

Analogously to FIG. 5 there is shown in FIG. 8 a schematic plan-view diagram of a substrate layer having upon its surface a blanket conformal conductor layer 14, upon which blanket conformal conductor layer 14 has been formed patterned conformal photosensitive layers 12a, 12b and 12c formed of a negative photoresist in accord with the method and materials of the second preferred embodiment of the present invention. The patterned conformal photosensitive layers 12a, 12b and 12c are formed through sequential photo-exposure of the blanket conformal photosensitive layer 12 formed of a negative photoresist material through the masks whose patterns are illustrated in FIG. 6 and FIG. 7, followed by developing of the photo-exposed blanket conformal photosensitive layer 12. The photo-exposed blanket conformal photosensitive layer 12 is developed through methods and materials as are conventional in the art including but not limited to wet chemical developing methods and dry plasma developing methods employing developer materials suitable to the negative photoresist from which is formed the photo-exposed blanket conformal photosensitive layer 12. The patterned conformal photosensitive layers 12a, 12b and 12c illustrated in FIG. 8 are equivalent to the patterned conformal photosensitive layers 12a, 12b and 12c illustrated in FIG. 5 with the exception that the patterned conformal photosensitive layers 12a, 12b and 12c illustrated in FIG. 8 are formed of a negative photoresist material.

Analogously to FIG. 3, FIG. 4 and FIG. 5, there is also shown in FIG. 6, FIG. 7 and FIG. 8 the presence of serifs of width X. The serifs are formed within: (1) the second region R2 of the third reticle, (2) the second region R2 of the fourth reticle, and (3) the second region R2 of the patterned conformal photosensitive layers 12a, 12b and 12c formed through the method and materials of the second preferred embodiment of the present invention. The serifs are formed for reasons outlined in the first preferred embodiment of the present invention. The serifs are also formed with a size described in the first preferred embodiment of the present invention and under the constraints outlined for the first preferred embodiment of the present invention.

Figure 9:
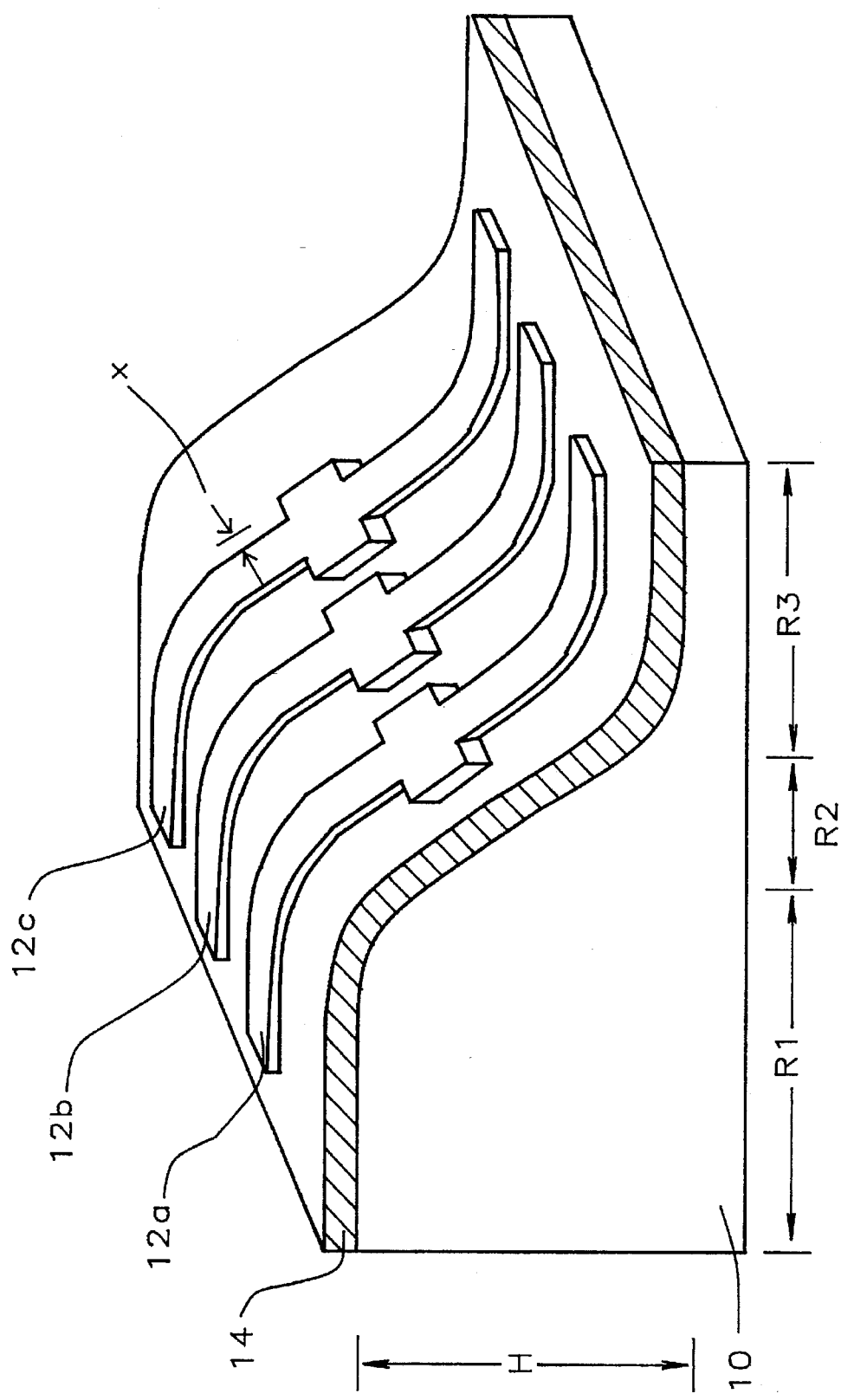
FIG. 9 shows a schematic perspective-view diagram of a high resolution patterned conformal photosensitive layer formed upon a high step height topography substrate layer in accord with the methods of the preferred embodiments of the present invention.

Referring now to FIG. 9, there is shown a schematic perspective-view diagram of a patterned conformal photosensitive layer upon a high step height topography semiconductor substrate in accord with the preferred embodiments of the present invention. Shown in FIG. 9 is a substrate layer 10 upon which resides a blanket conductor layer 14. Upon the blanket conductor layer 14 have been photo-exposed and developed through methods described in the first preferred embodiment of the present invention and the second preferred embodiment of the present invention the patterned conformal photosensitive layers 12a, 12b and 12c. The patterned conformal photosensitive layers 12a, 12b and 12c are formed with high resolution throughout the topographic step height variation H of the substrate layer 10 upon which they are formed.

As is understood by a person skilled in the art, the preferred embodiments of the present invention are illustrative of the present invention rather than limiting of the present invention. Revisions may be made to methods, materials and structures through which are formed the preferred embodiments of the present invention while still forming embodiments which are within the spirit and scope of the present invention.

What is claimed is:

1. A method for photo-exposing within an integrated circuit a blanket conformal photosensitive layer upon a high step height topography substrate layer comprising:

providing within an integrated circuit a high step height topography substrate layer having a blanket conformal photosensitive layer formed thereupon, the high step height topography substrate layer having a first region having a first step height separated from a third region having a third step height by a second region having a second step height, the second step height being intermediate to the first step height and the third step height;

photo-exposing the blanket conformal photosensitive layer to form a first pattern upon the first region and the second region through the use of a first reticle and a first photo-exposure condition, the first photo-exposure condition providing a first depth of focus suitable for at least the first region; and, photo-exposing the blanket conformal photosensitive layer to form a second pattern upon the second region and the third region through use of a second reticle and a second photo-exposure condition, the second photo-exposure condition providing a second depth of focus suitable for at least the third region, where the first pattern upon the second region and the second pattern upon the second region overlap, and where at least one of the first pattern upon the second region and the second pattern upon the second region has a serif formed therein, the serif providing improved resolution of the aggregate of the first pattern upon the second region and the second pattern upon the second region when both the first depth of focus and the second depth of focus are not suitable for the second region.

2. The method of claim 1 wherein thickness of the blanket conformal photosensitive layer is from about 10000 to about 12000 angstroms.

3. The method of claim 1 wherein the blanket conformal photosensitive layer is a photoresist layer.

4. The method of claim 3 wherein the photoresist layer is formed from a positive photoresist material.

5. The method of claim 3 where the photoresist layer is formed from a negative photoresist material.

6. The method of claim 1 wherein difference in step height between the first region and the third region is a topographic step height variation of from about 12000 to about 20000 angstroms.

7. The method of claim 1 wherein the first depth of focus and the second depth of focus are from about 6000 to about 8000 angstroms each.

8. The method of claim 1 wherein the vertical distance of the blanket conformal photosensitive layer within second region is approximately equal to the first depth of focus and the vertical distance of the blanket conformal photosensitive layer within the second region is within neither the first depth of focus nor the second depth of focus.

9. The method of claim 1 wherein the serif is formed through a pattern exposed through the first reticle only.

10. The method of claim 1 wherein the serif is formed through a pattern exposed through the second reticle only.

11. The method of claim 1 wherein the serif is formed through a patterned exposed through both the first reticle and the second reticle.

12. The method of claim 11 wherein the thickness of the serif is approximately one-half the registration tolerance of the photo-exposure tooling employed in registering the first reticle and the second reticle to the high step height topography substrate layer.

13. A method for forming within an integrated circuit a patterned conductor layer upon a high step height topography substrate layer comprising:

providing within an integrated circuit a high step height topography substrate layer having a blanket conductor layer formed thereupon, the blanket conductor layer having a blanket conformal photosensitive layer formed thereupon, the high step height topography substrate layer having a first region having a first step height separated from a third region having a third step height by a second region having a second step height, the second step height being intermediate to the first step height and the third step height;

photo-exposing the blanket conformal photosensitive layer to form a first pattern upon the first region and the second region through use of a first reticle and a first photo-exposure condition, the first photo-exposure condition providing a first depth of focus suitable for at least the first region;

photo-exposing the blanket conformal photosensitive layer to form a second pattern upon the second region and the third region through use of a second reticle and a second photo-exposure condition, the second photo-exposure condition providing a second depth of focus suitable for at least the third region, where the first pattern upon the second region and the second pattern upon the second region overlap, and where at least one of the first pattern upon the second region and the second pattern upon the second region has a serif formed therein, the serif providing improved resolution for the aggregate of the first pattern upon the second region and the second pattern upon the second region when both the first depth of focus and the second depth of focus are not suitable for the second region;

developing then the photo-exposed blanket conformal photosensitive layer to form a patterned conformal photosensitive layer; and, etching the blanket conductor layer to form a patterned conductor layer using the patterned conformal photosensitive layer as an etch mask.

14. The method of claim 13 wherein the thickness of the blanket conductor layer is from about 2000 to about 10000 angstroms.

15. The method of claim 13 wherein the thickness of the blanket conformal photosensitive layer is from about 10000 to about 12000 angstroms.

16. The method of claim 13 wherein difference in step height between the first region and the third region is a topographic step height variation of from about 12000 to about 20000 angstroms.

17. The method of claim 13 wherein the first depth of focus and the second depth of focus are from about 6000 to about 8000 angstroms each.

18. The method of claim 13 wherein the vertical distance of the blanket conformal photosensitive layer within second region is approximately equal to the first depth of focus and the vertical distance of the blanket conformal photosensitive layer within the second region is within neither the first depth of focus nor the second depth of focus.

19. The method of claim 13 wherein the serif is formed through a pattern exposed through both the first reticle and the second reticle.

* * * * *